US006739190B2

(12) United States Patent
Hsu et al.

(10) Patent No.: US 6,739,190 B2
(45) Date of Patent: May 25, 2004

(54) MICROMECHANICAL RESONATOR DEVICE

(75) Inventors: Wan-Thai Hsu, Ann Arbor, MI (US); Clark T. C. Nguyen, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 09/938,412

(22) Filed: Aug. 23, 2001

(65) Prior Publication Data

US 2002/0069701 A1 Jun. 13, 2002

Related U.S. Application Data

(60) Provisional application No. 60/227,503, filed on Aug. 24, 2000, and provisional application No. 60/227,507, filed on Aug. 24, 2000.

(51) Int. Cl.$^7$ ................................................. G01P 3/00
(52) U.S. Cl. ....................................................... 73/497
(58) Field of Search ............................... 73/497, 514.32

(56) References Cited

U.S. PATENT DOCUMENTS

| 5,955,932 | A | * | 9/1999 | Nguyen et al. | ............ | 333/186 |
| 5,976,994 | A | * | 11/1999 | Nguyen et al. | ............ | 438/795 |
| 6,249,073 | B1 | * | 6/2001 | Nguyen et al. | ............ | 310/309 |
| 6,424,074 | B2 | * | 7/2002 | Nguyen | ....................... | 310/309 |

OTHER PUBLICATIONS

Hsu, Wan–Thai, et al., Geometric Stress Compensation For Enhanced Thermal Stability In Micromechanical Resonators, IEEE International Ultrasonics Symposium, Oct. 5–8, 1998, pp. 945–948.

Nguyen, Clark T.–C., Micromachining Technologies For Miniaturized Communication Devices, Proceedings of SPIE: Micromachining and Microfabrications, Santa Clara, CA, Sep. 20–22, 1998, pp. 24–38.

Wang, Kun, et al., VHF Free—Free Beam High–Q Micromechanical Resonators, XP–000830790, Jan. 17, 1999, pp. 453–458.

Nguyen, Clark T.–C., Frequency–Selective MEMS For Miniaturized Communication Devices, IEEE, 1998, pp. 445–460.

* cited by examiner

*Primary Examiner*—Helen Kwok
(74) *Attorney, Agent, or Firm*—Brooks Kushman P.C.

(57) ABSTRACT

A micromechanical resonator device is disclosed that utilizes competition between the thermal dependencies of geometrically tailored stresses and Young's modulus to (1) reduce the temperature coefficient ($TC_f$) of the resonance frequencies of the micromechanical resonator device without any additional power consumption; and (2) introduce a zero $TC_f$ temperature at which subsequent oven-controlled resonators may be biased. A key feature in this resonator design involves the strategic sizing of the geometries of the resonator and its support structure to harness thermal expansion temperature coefficients that oppose and cancel those of Young's modulus variation. This transforms the original monotonically decreasing resonance frequency versus temperature curve to an S-shaped curve (or a linear one with a much smaller slope), with a smaller overall frequency excursion over a given temperature range, and with points at which the resonance frequency $TC_f$ is zero. This design strategy is a key to attaining the needed temperature stability for reference oscillator applications in portable wireless communications and for RF channel-select filter banks. In addition, for cases where the thermal response of a resonator need not be nulled, but rather must satisfy a given shape, this technique can also be used to tailor a specific resonance frequency versus temperature curve.

29 Claims, 4 Drawing Sheets

MICROMECHANICAL RESONATOR DEVICE

CROSS-REFERENCE TO RELATED APPLICATIONS

This application claims the benefits of U.S. provisional patent applications Serial No. 60/227,503 filed Aug. 24, 2000 and entitled "Geometric Stress-Compensated Temperature-Insensitive Micromechanical Resonators" and Serial No. 60/227,507 also filed Aug. 24, 2000 and entitled "Process Technology For Lateral Small-Gap Micromechanical Structures."

STATEMENT REGARDING FEDERALLY SPONSORED RESEARCH OR DEVELOPMENT

The invention was made with Government support under DARPA Contract No. F30602-97-2-0101. The Government has certain rights in the invention.

BACKGROUND OF THE INVENTION

1. Field of the Invention

This invention relates to micromechanical resonator devices.

2. Background Art

Recent advances in micromachining technology that yield high-Q microscale mechanical resonators may soon enable substantial size and potential cost reductions for the highly stable oscillators used in communication and timekeeper applications. In particular, IC-compatible surface-micromachined mechanical resonators from MF to VHF frequencies with Q's in excess of 10,000 have been demonstrated in polycrystalline silicon structural materials. Prototype high-Q oscillators featuring micromechanical (or "μmechanical") resonators integrated together with sustaining electronics, all in a single chip, using a planar process that combines surface-micromachining and integrated circuits, have also been demonstrated. Unfortunately, although the Q of the resonators in these oscillators is sufficient to garner respectable short-term stability, their thermal stability falls well short of the needed specifications, typically exhibiting frequency variations on the order of 1870 ppm over a 0° C. to 85° C. range, as shown in FIG. 1, which compares the performance of a polysilicon folded beam μmechanical resonator with that of AT-cut quartz. Although techniques exist to alleviate this thermal dependence (e.g., temperature compensation circuitry, or oven control), all of them consume significant amounts of power, and thus, reduce the battery lifetime of portable devices.

In the article entitled "Geometric Stress Compensation for Enhanced Thermal Stability in Micromechanical Resonators" W.-T. Hsu et al., ULTRAS. SYMP., 1998, pp. 945–948, a geometric stress-compensation design technique is disclosed with respect to low-frequency (LF, e.g., 80 kHz) nickel folded-beam μmechanical resonators that used a geometrically-tailored stress versus temperature function to cancel the thermal dependence of the material Young's modulus, resulting in an overall lower frequency excursion over a given temperature range, and generating zero temperature coefficient $TC_{fo}$, points in the process.

SUMMARY OF THE INVENTION

An object of the present invention is to provide an improved micromechanical resonator device.

In carrying out the above objects and other objects of the present invention, a temperature-compensated, micromechanical resonator device is provided. The device includes a substrate, a flexural-mode resonator having first and second ends, and a temperature-compensating support structure anchored to the substrate to support the resonator at the first and second ends above the substrate. Both the resonator and a support structure are dimensioned and positioned relative to one another so that the resonator has enhanced thermal stability.

Energy losses to the substrate may be substantially reduced to allow higher resonator device Q.

The support structure may not vibrate during vibration of the resonator.

The device may further include a drive electrode structure formed on the substrate at a position to allow electrostatic excitation of the resonator. The resonator and the drive electrode structure define a first gap therebetween which is preferably a submicron lateral capacitive gap.

The device may further include a sense electrode structure formed on the substrate at a position to sense output current based on motion of the resonator. The resonator and the sense electrode define a second gap therebetween which is preferably a submicron lateral capacitive gap.

The resonator is preferably a single resonator beam.

The support structure may include an anchor for rigidly anchoring the first end of the resonator to the substrate and a folding truss support structure for substantially decoupling the second end of the resonator from the substrate.

The resonator is preferably a lateral resonator. The support structure may include a pair of stress generating support members dimensioned relative to the resonator so that the resonator has enhanced thermal stability. The support members may be rigid against lateral motions.

The resonator may be a polysilicon resonator such as a polysilicon resonator beam.

The electrode structures may be metal such as plated metal electrodes.

The substrate may be a semiconductor substrate such as a silicon substrate.

Further in carrying out the above objects and other objects of the present invention, a micromechanical resonator device having a frequency versus temperature curve is provided. The device includes a substrate, a flexural-mode resonator having first and second ends, and a support structure separate from the resonator and anchored to the substrate to support the resonator at the first and second ends above the substrate. Both the resonator and a support structure are dimensioned and positioned relative to one another so that the frequency versus temperature curve is specifically tailored.

Such tailoring may increase temperature dependence of the resonator so that the device may be used as a temperature sensor.

Such tailoring may introduce peaks and valleys in the curve at predetermined locations.

Still further in carrying out the above objects and other objects of the present invention, a micromechanical resonator device is provided. The device includes a substrate, a flexural-mode resonator having first and second ends, and a support structure separate from the resonator and anchored to the substrate to support the resonator at the first and second ends above the substrate. Both the resonator and a support structure are dimensioned and positioned relative to one another so that the device has a substantially zero temperature coefficient temperature at which the device may be biased.

The micromechanical resonator device disclosed herein offers a method for negating the above thermal dependencies without the need for additional power consumption. In cases where power is not a large concern, the temperature-insensitive design technique of this disclosure can be combined with temperature compensating or oven-control circuits to attain thermal stabilities superior to those achievable via present-day macroscopic resonators at a given power level.

The above object and other objects, features, and advantages of the present invention are readily apparent from the following detailed description of the best mode for carrying out the invention when taken in connection with the accompanying drawings.

DETAILED DESCRIPTION OF THE PREFERRED EMBODIMENTS

The disclosed resonator is designed to vibrate in a flexural-mode, for which temperature dependence is dominated by the following factors: (1) stress changes due to thermal expansion or contraction of clamped beams; (2) Young's modulus temperature dependence; and (3) dimensional changes due to thermal expansion or contraction of released beams. Of the above causes, Young's modulus and stress variations with temperature have the strongest impact on resonance frequency. For the majority of current resonator designs, these two causes combine to yield a monotonically decreasing resonance frequency versus temperature curve. For example, the resonance frequency of a phosphorous-doped polysilicon clamped-clamped beam resonator has a negative Young's modulus temperature coefficient ($TC_f$) and a negative $TC_f$ due to clamped-beam expansion. These $TC_f$'s is add to yield a net negative temperature coefficient.

The high-Q, temperature-insensitive micromechanical resonator device of the present invention takes advantage of strategic geometric design to introduce stresses caused by thermal expansion or compression that oppose and cancel frequency changes brought about by the temperature-dependence of the Young's modulus, resulting in a smaller overall frequency excursion over a given temperature range. In some cases, this method also transforms the original monotonically decreasing resonance frequency versus temperature curve to a U- or S-shaped curve (or still a linear curve), with a smaller overall frequency excursion over a given temperature range, and with points at which the resonance frequency $TC_f$ is zero.

Figure 1:
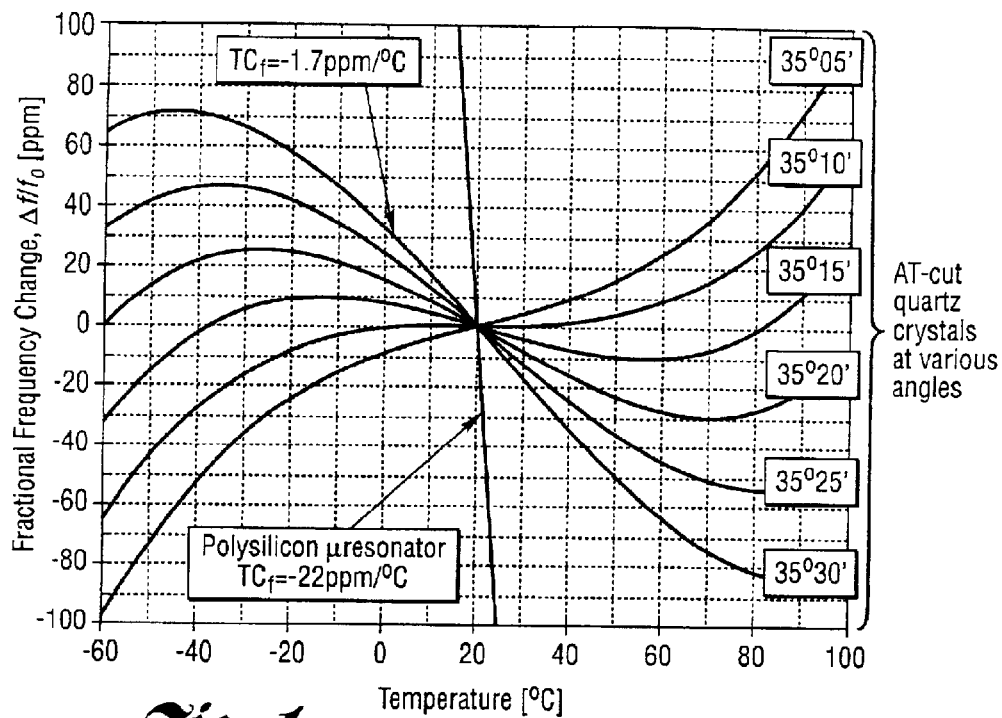
FIG. 1 shows graphs or plots of fractional frequency change versus temperature for an equal-folded beam polysilicon μmechanical resonator and AT-cut quartz crystals with various cut angles.
Figure 2A:
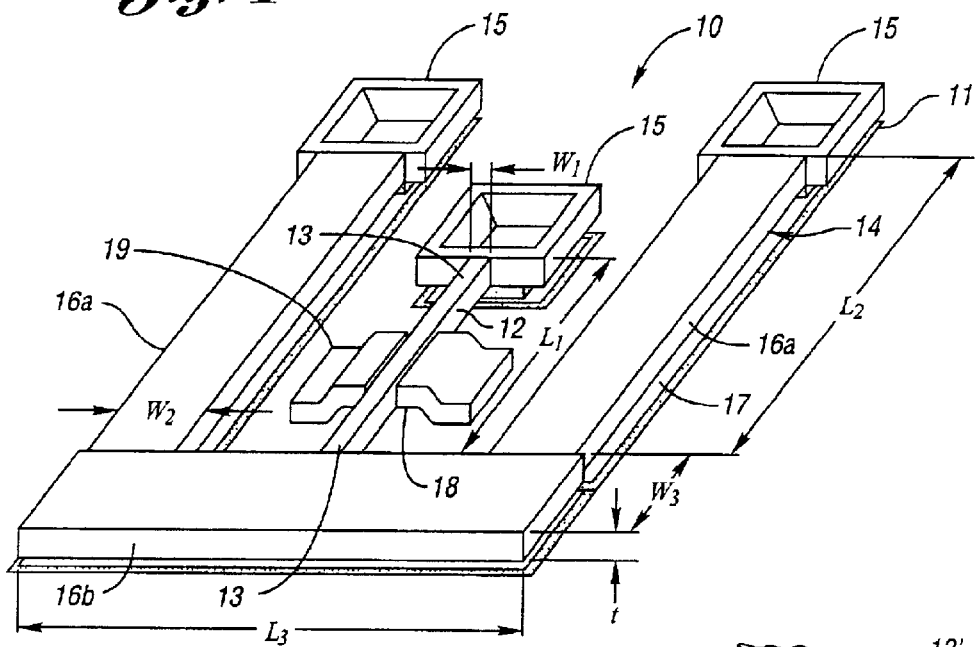
FIG. 2a is a perspective schematic view of a temperature-insensitive micromechanical resonator device constructed in accordance with the present invention, indicating major components and dimensions.

FIG. 2a presents a schematic of a simplified version of the above-described temperature-insensitive μresonator device, generally indicated at 10, including a substrate 11. As shown, the device 10 comprises a clamped-clamped beam resonator 12 having ends 13 supported by a folded support structure, generally indicated at 14, strategically designed so that an increase in temperature gives rise to tension in the resonator beam 12, which increases the resonator resonance frequency and opposes decreases in frequency caused by Young's modulus temperature dependence. The support structure 14 has an anchor 15 to anchor one end 13 of the beam 12 to the substrate 11 above a ground plane 17.

Briefly, the folded support structure 14 includes outer support beams 16a connected by a truss beam 16b. The opposite end 13 of the beam 12 is supported by the beam 16b in a state more decoupled from the substrate 11 than the end 13 directly anchored to the substrate 11.

The outer support beams 16a are designed to be longer than the resonator beam 12 (i.e. $L_2>L_1$), and thus, will expand faster than it with increasing temperature, giving rise to net tension in the resonator beam 12. Again, this tension contributes to a cancelling of temperature coefficients that gives rise to a smaller resonance frequency excursion over the temperature range of interest. Extension of these concepts to folded-beam, comb-driven resonators is straightforward.

Metal or polysilicon electrodes including a drive electrode 18 and a sense electrode 19 allow lateral resonance operation of the device 10.

To ensure only the resonator beam 12 vibrates when excitation signals are applied to the drive electrode 18, the outer support beams 16a are made much wider than the resonator beam (i.e. $W_2>W_1$) making them rigid against lateral motions.

Figure 2B:
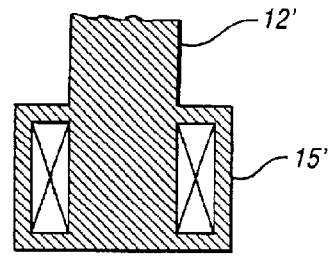
FIG. 2b is a schematic view, partially broken away and in cross-section, of an off-axis anchor design that substantially eliminates beam bending.

FIG. 2b shows a modified anchor design for a beam 12' including anchors 15' (only one of three are shown) that substantially eliminate beam bending. The anchors 15' redirects top-to-bottom side expansion differences so that they occur only in a direction orthogonal to the length of the resonator (or support) beam, thus, eliminating beam bending along the length of the beam 12'.

10 MHz Temperature-Insensitive Resonators

Polysilicon versions of the design of FIG. 2 have been fabricated and tested including a 13 MHz version of such a resonator. The fabrication technology used to attain this device utilized a combination of conventional polysilicon surface-micromachining with plated metal electrodes to allow lateral resonance operation. As such, the device represents a successful merging of polysilicon technology with the metal plating technologies.

Figure 3A:
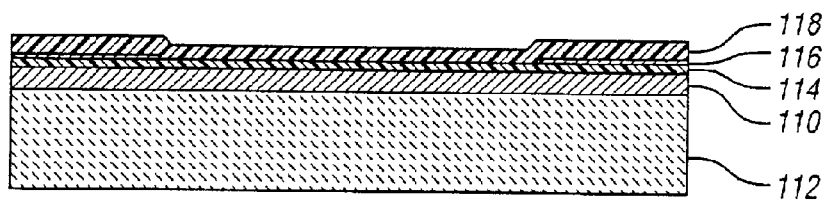
FIG. 3a is a side sectional schematic view of an insulation layer comprising oxide and nitride layers formed on a substrate, a patterned polysilicon layer and a sacrificial oxide layer deposited thereon.

A preferred embodiment for a small-gap, lateral resonator process flow is presented in FIGS. 3a–3h. As shown in FIG. 3a, this process starts with a 2 $\mu$m thick oxide film 110 (i.e. $SiO_2$) thermally grown on a silicon substrate 112 and a 3000 Å thick film 114 of nitride (i.e. $Si_3N_4$) which together serve as an isolation layer. After a 3000 Å thick low stress polysilicon layer 116 is deposited via LPCVD and patterned via reactive ion etching (RIE), a 5000 Å thick layer 118 of sacrificial oxide (i.e. $SiO_2$) is deposited by LPCVD.

Figure 3B:
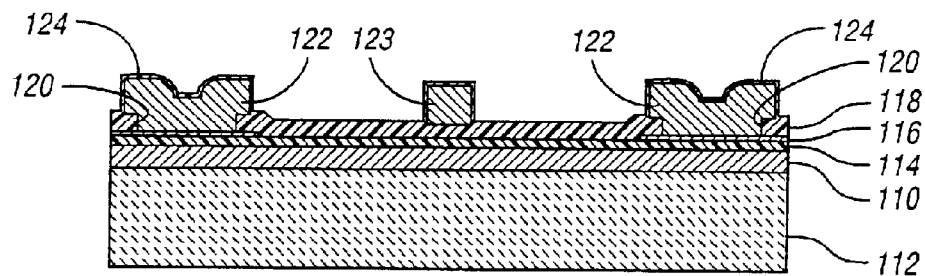
FIG. 3b is a side sectional schematic view of the layers of FIG. 1a after opening for anchors are formed, a patterned polysilicon layer within the openings and in the field and a gap sacrificial oxide deposited thereon.

As shown in FIG. 3b, vias 120 are patterned into the sacrificial oxide layer 118 by RIE, exposing the underlying polysilicon layer 116 in specific areas to later serve as anchors for eventual structures. A 2 $\mu$m thick structural layer of low stress polysilicon is then deposited via LPCVD and patterned also via RIE to form anchor structures 122 and a resonator structure 123 with straight side walls. A 1000 Å thick layer 124 of conformal LPCVD oxide is then deposited in order to define the small-gap spacing of the present invention.

Figure 3C:
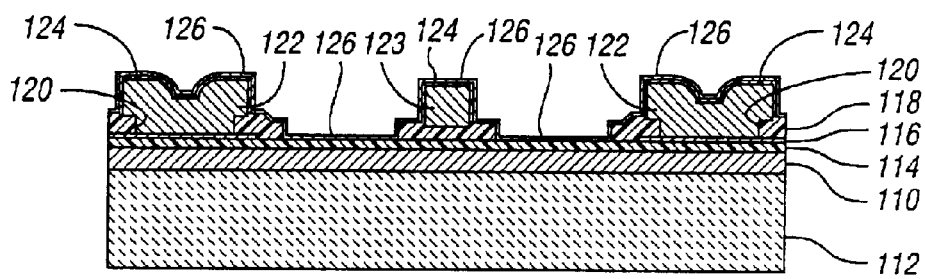
FIG. 3c is a side sectional schematic view of the sacrificial oxide after etching and with an evaporated seed layer together with the structures of FIG. 1b.

As shown in FIG. 3c, the sacrificial oxide layer 118 is then etched (RIE and wet etch) until the isolation nitride layer 114 is exposed at regions where metal electrodes are to be formed. A thin metal layer (Cr200 Å/Au300 Å/Cr200 Å) is then evaporated over all areas of the wafer to serve as a seed layer 126 for electrode plating. The top Cr layer is used to enhance the adhesion between the seed layer 126 and a plating mold while the bottom Cr layer is for the adhesion between Au and the underneath nitride layer 114.

Figure 3D:
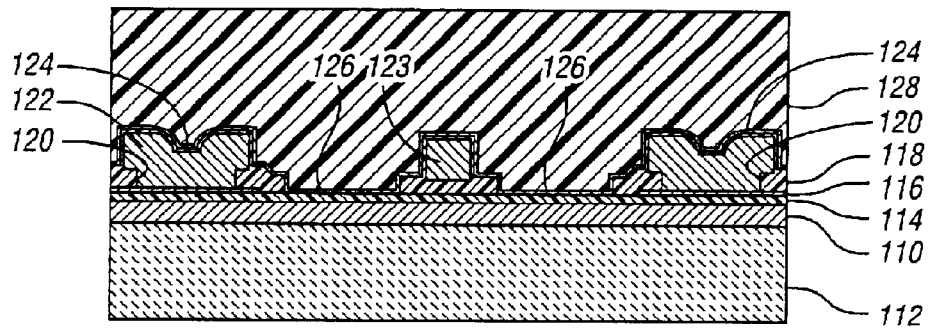
FIG. 3d is a side sectional schematic view of a thick photoresist for planarization etch back which has been spun on the structures of FIG. 1c.
Figure 3E:
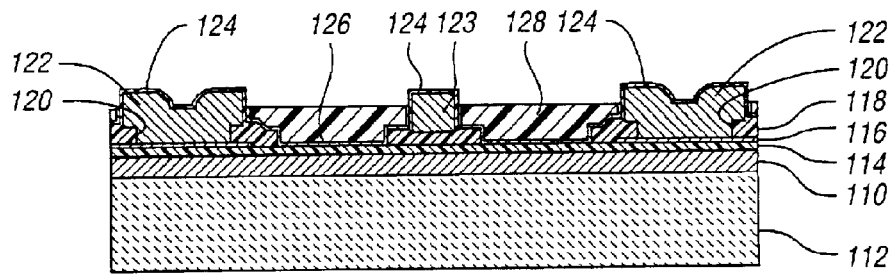
FIG. 3e is a side sectional schematic view with the PR etched back to the top of the structures and the seed layer etched on the top of the structures.

As shown in FIG. 3d, in order not to plate metal on top of the structures 122 and 123 while forming the electrode, a thick layer 128 of photoresist (PR) is spun on. Then, the layer 128 is planarized and etched back via RIE to expose the seed metal layer 126 on top of the structures 122 and 123 as shown in FIG. 3e. The seed layer 126 on top of the structures 122 and 123 is then removed by wet etching to prevent metal from plating over the tops of the polysilicon structures 122 and 123 during subsequent electroplating steps.

Figure 3F:
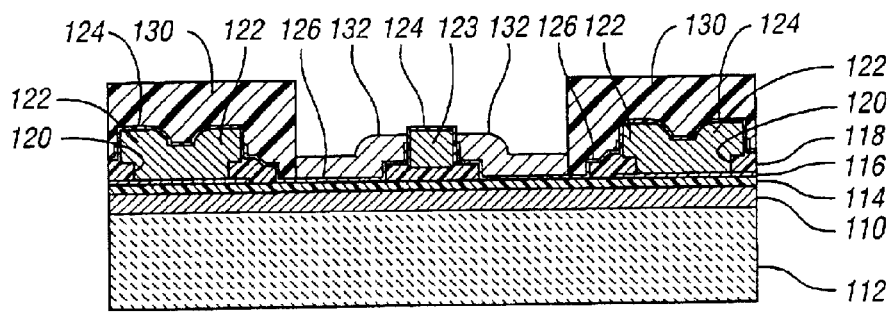
FIG. 3f is a side sectional schematic view of the structures of FIG. 1e after the PR is stripped, a PR plating mold is formed and Au electrodes are plated.

As shown in FIG. 3f, after the rest of the PR is removed, a plating PR mold 130 is formed by lithography, Cr on top of the seed layer 126 is removed and then Au electrodes 132 are plated on the exposed Au seed layer 126 between vertical side walls of the resonator structure 123 and the photoresist mold 130 which define the electrode plating boundaries.

Figure 3G:
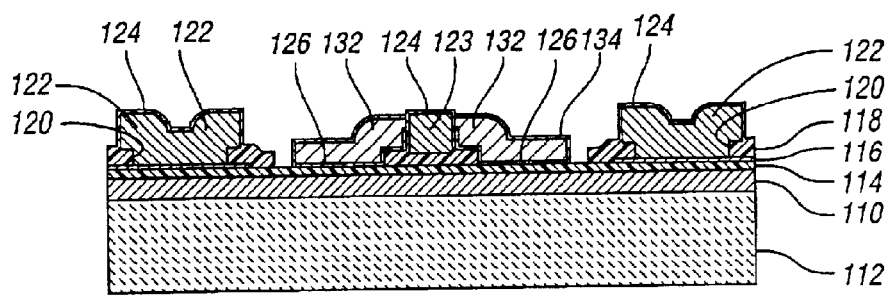
FIG. 3g is a side sectional schematic view of the structures of FIG. 1f with the PR mold stripped, the seed layers removed and an Ni layer formed on the electrodes.

As shown in FIG. 3g, a thin layer 134 of Ni is plated on the electrodes 132 in order to protect the surface of the Au electrode regions while the seed layer 126 is being removed. FIG. 3g shows the PR mold 130 and the seed layer 126 removed.

Figure 3H:
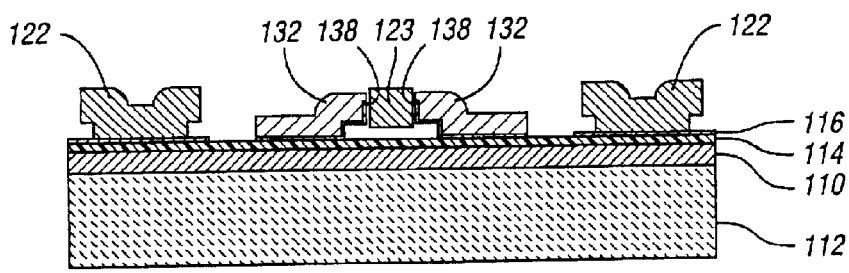
FIG. 3h is a side sectional schematic view of the structures of FIG. 1g after HF release and the Ni layer removed.

As shown in FIG. 3h, the layer 134 of Ni is removed and finally, the resonator structure 124 separated by sub-micron gaps 138 between two metal electrodes 122 is free to move after HF release.

Figure 4:
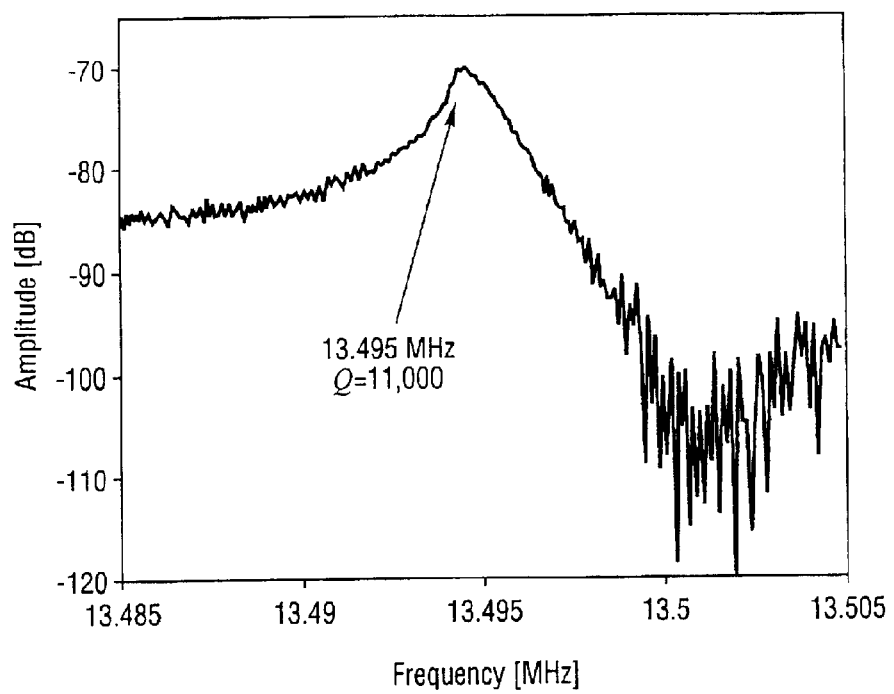
FIG. 4 is a frequency spectrum of a 13 MHz version of a resonator of the present invention measured under 50 μTorr vacuum (Q~11,000)

The measured frequency spectrum for the device is shown in FIG. 4. The Q extracted from this plot is close to 11,000, which is high enough to attain good phase noise performance in an oscillator using this resonator.

Figure 5:
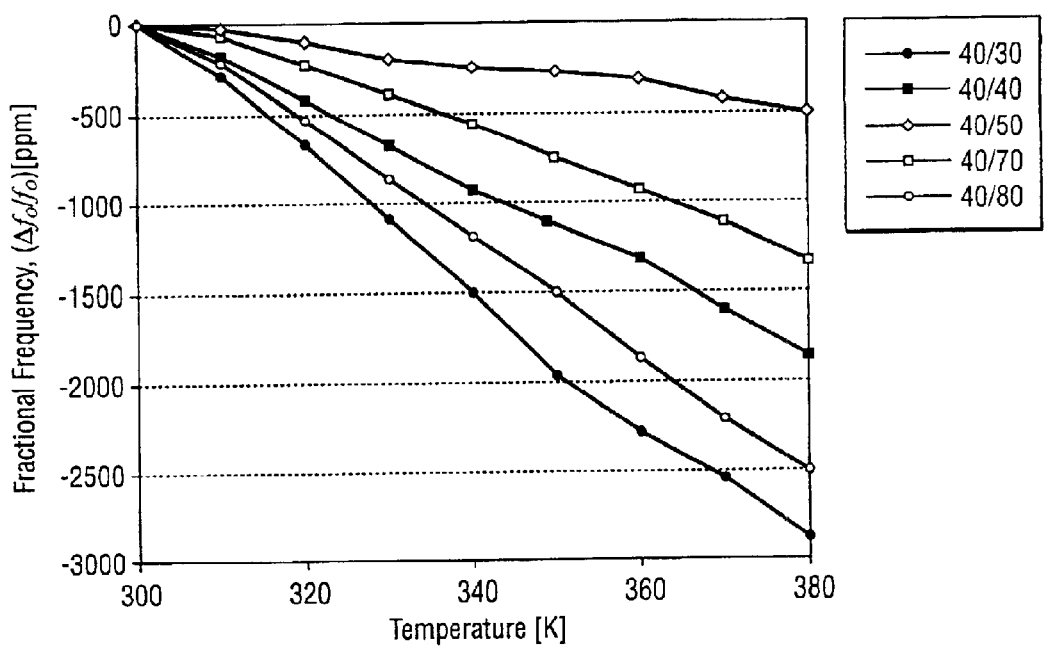
FIG. 5 shows graphs or plots of fractional frequency change versus temperature for a 13 MHz resonator of the present invention with varying $L_1/L_2$ beam ratios.

FIG. 5 presents a plot of fractional frequency change versus temperature for the 13 MHz resonator with varying $L_1/L_2$ beam ratios (see FIG. 2). From this plot, control of the temperature variation can clearly be seen. In particular, for $L_1/L_2$ beam ratios from 40/30 to 40/50, the temperature coefficient decreases. However, for higher beam ratios, the temperature coefficient degrades. This can be explained via a mechanism where the support beams bend upwards or downwards when the stress in the beams becomes larger for devices with large $L_1/L_2$ beam ratios. These support problems can be alleviated using stiffening structures to prevent out-of-plane movements of the supports. In some cases, however, bending of supports can actually help to decrease the temperature coefficient, so support bending is not always detrimental.

Benefits accruing to the invention are numerous. For example, the main advantages and contributions of this invention are:

(i) A method for greatly reducing the temperature coefficient of a micromechanical resonator's resonance frequency without the need for power consumption and using only a single layer of structural material;

(ii) A method for controlling the frequency of a micromechanical resonator as a function of temperature. This feature can be extremely useful in a variety of circuits that expect the resonator to have a pre-defined temperature response; and (iii) A possible method for controlling the Q of a micromechanical resonator as a function of temperature. This comes about because stress in a beam also affects the Q of a micromechanical resonator.

The present invention provides a general design technique in which geometric stresses that change as a function of temperature are used to influence the resonance frequency of a micromechanical resonator for the purposes of controlling the frequency versus temperature characteristic of a micromechanical resonator. Furthermore, the present invention uses a geometric design that gives a substantially flat frequency versus temperature curve.

The above-described geometric-stress design technique is not limited only to temperature compensation, but can also be used to more generally tailor the frequency versus temperature curve for any mechanical resonator device. For example, the support structure might be designed to increase the temperature dependence of the resonator for use as a temperature sensor. Or the temperature curve might be tailored to have peaks and valleys in certain predefined locations.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A temperature-compensated, micromechanical resonator device comprising:

a substrate;

a resonant element having first and second ends and wherein the resonant element vibrates in a flexural mode; and a temperature-compensating support structure anchored to the substrate to support the resonant element at the first and second ends above the substrate wherein the support structure includes a first support member and a second support member for coupling the first support member to the resonant element, and wherein the first support member and the resonant element have different effective lengths so that the resonator device has enhanced thermal stability.

2. The device as claimed in claim 1 further comprising a drive electrode structure formed on the substrate at a position to allow electrostatic excitation of the resonant element wherein the resonant element and the drive electrode structure define a first gap therebetween.

3. The device as claimed in claim 2 wherein the first gap is a submicron lateral capacitive gap.

4. The device as claimed in claim 2 further comprising a sense electrode structure formed on the substrate at a position to sense output current based on motion of the resonant element wherein the resonant element and the sense electrode structure define a second gap therebetween.

5. The device as claimed in claim 4 wherein the second gap is a submicron lateral capacitive gap.

6. The device as claimed in claim 1 wherein the resonant element is a single resonator beam.

7. The device as claimed in claim 1 wherein the support structure includes an anchor for rigidly anchoring the first end of the resonant element to the substrate and a folding truss support structure for substantially decoupling the second end of the resonant element from the substrate.

8. The device as claimed in claim 1 wherein the resonant element is a lateral resonator and wherein the support structure includes a pair of stress generating support members dimensioned relative to the resonator so that the resonator has enhanced thermal stability.

9. The device as claimed in claim 1 wherein the resonant element is a polysilicon resonator.

10. The device as claimed in claim 9 wherein the resonant element is a polysilicon resonator beam.

11. The device as claimed in claim 4 wherein the electrode structures are metal.

12. The device as claimed in claim 11 wherein the electrode structures include plated metal electrodes.

13. The device as claimed in claim 1 wherein the substrate is a semiconductor substrate.

14. The device as claimed in claim 1 wherein the semiconductor substrate is a silicon substrate.

15. The device as claimed in claim 1 wherein the support structure does not substantially vibrate during vibration of the resonant element.

16. The device as claimed in claim 1 wherein energy losses to the substrate are substantially reduced to allow higher resonator device Q.

17. The device as claimed in claim 8 wherein the support members are rigid against lateral motions.

18. The device as claimed in claim 7 wherein the anchor is an off-axis anchor.

19. The device as claimed in claim 1 wherein the device is a temperature sensor.

20. A micromechanical resonator device having a frequency versus temperature curve, the device comprising:
a substrate;
a resonant element having first and second ends and wherein the resonant element vibrates in a flexural mode; and
a temperature-compensating support structure anchored to the substrate to support the resonant element at the first and second ends above the substrate wherein the support structure includes a first support member and a second support member for coupling the first support member to the resonant element, and wherein the first support member and the resonant element have different effective lengths so that the frequency versus temperature curve is specifically tailored.

21. The device as claimed in claim 20 wherein the frequency versus temperature curve is designed to increase temperature dependance of the resonant element.

22. The device as claimed in claim 20 wherein the frequency versus temperature curve is designed to have peaks and valleys in predefined locations.

23. A micromechanical resonator device comprising:
a substrate;
a resonant element having first and second ends and wherein the resonant element vibrates in a flexural mode; and
a temperature-compensating support structure anchored to the substrate to support the resonant element at the first and second ends above the substrate wherein the support structure includes a first support member and a second support member for coupling the first support member to the resonant element, and wherein the first support member and the resonant element have different effective lengths so that the device has a substantially zero temperature coefficient temperature at which the device may be biased.

24. The device as claimed in claim 1 wherein the first and second support members of the support structure are wider than the resonant element such that the support structure is non-vibratory during operation of the device.

25. The device as claimed in claim 1, wherein the first support member does not vibrate during resonant vibration of the resonant element.

26. The device as claimed in claim 25, wherein the second support member does not vibrate during resonant vibration of the resonant element.

27. The device as claimed in claim 1, wherein the resonant element vibrates in a lateral flexural mode.

28. The device as claimed in claim 20, wherein the resonant element vibrates in a lateral flexural mode.

29. The device as claimed in claim 23, wherein the resonant element vibrates in a lateral flexural mode.

* * * * *